United States Patent
Weinstein et al.

(10) Patent No.: US 7,250,892 B2
(45) Date of Patent: Jul. 31, 2007

(54) DATA CONVERTER WITH INTEGRATED MEMS RESONATOR CLOCK

(75) Inventors: Michael J. Weinstein, Los Altos, CA (US); Duncan Gurley, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/220,280

(22) Filed: Sep. 6, 2005

(65) Prior Publication Data
US 2007/0052565 A1    Mar. 8, 2007

(51) Int. Cl.
H03M 1/12    (2006.01)
H03M 1/66    (2006.01)

(52) U.S. Cl. .................... 341/155; 341/144; 341/122; 331/154

(58) Field of Classification Search ............. 341/122, 341/144, 155
See application file for complete search history.

(56) References Cited

U.S. PATENT DOCUMENTS

| | | | |
|---|---|---|---|
| 6,194,973 B1 * | 2/2001 | Williamson | 331/109 |
| 6,275,122 B1 | 8/2001 | Speidell et al. | |
| 6,476,749 B1 | 11/2002 | Yeap et al. | |
| 6,808,954 B2 * | 10/2004 | Ma et al. | 438/51 |
| 6,819,103 B2 * | 11/2004 | Champion et al. | 324/260 |
| 2002/0145489 A1 * | 10/2002 | Cornett et al. | 333/197 |
| 2004/0058591 A1 | 3/2004 | Avazi et al. | |
| 2005/0285692 A1 * | 12/2005 | Mattila et al. | 331/175 |
| 2006/0139113 A1 | 6/2006 | Menke | |
| 2006/0158268 A1 * | 7/2006 | McCorquodale et al. | 331/34 |

FOREIGN PATENT DOCUMENTS

| | | |
|---|---|---|
| EP | 0658979 A3 | 6/1995 |
| JP | 2005079981 A * | 3/2005 |
| WO | WO 03/073607 A1 | 9/2003 |
| WO | WO 2005/076480 A1 | 8/2005 |

OTHER PUBLICATIONS

Senger et al., A 16-bit Mixed-Signal MicroSystem with Integrated CMOS-MEMS Clock Reference, ACM/IEEE 40th Design Automation Conference, Jun. 2003, pp. 520-525.*
Chang; "Semiconductor Technology Considerations in High Speed Data Conversion"; IEEE CSIC Digest; Jul. 2004; pp. 31-34.
Townsend, et al.; "Recent Advances and Future Trends in Low Power Wireless Systems for Medical Applications"; IEEE; 2005; pp. 476-481.

* cited by examiner

*Primary Examiner*—Howard L. Williams

(57) ABSTRACT

An improved clocked data converter with a vibrating microelectromechanical systems (MEMS) resonator. The MEMS resonator is used as part of the clock circuitry of an analog to digital converter or a digital to analog converter. The MEMS resonator may be used as the frequency determining element of an on-chip oscillator, or as a bandpass filter used to clean up an external clock signal.

10 Claims, 3 Drawing Sheets

DATA CONVERTER WITH INTEGRATED MEMS RESONATOR CLOCK

TECHNICAL FIELD

Embodiments in accordance with the invention are related to analog to digital and digital to analog data converters (ADCs and DACs), and to clocking of data converters.

BACKGROUND

Analog to digital converters (ADCs) and digital to analog converters (DACs) are used in a wide variety of electronic systems, bridging the analog and digital worlds. They are widely used as modular components as well as key components in system-on-chip (SOC) integrated circuits. ADCs and DACs are clocked components, performing conversions according to a clock signal. The performance of both analog to digital converters and digital to analog to digital converters is adversely affected by the effects of clock jitter. Jitter is the result of imperfect clock sources, and of clock signal propagation problems including signal reflections and noise contamination. Some data converter topologies, e.g. sigma-delta types, are especially sensitive to clock jitter. In spite of advances in phased lock loop (PLL) technology, clock jitter remains a key obstacle to improving data converter performance.

SUMMARY OF THE INVENTION

A vibrating microelectromechanical systems (MEMS) resonator is integrated with one or more data converters, providing an improved clock signal. The MEMS resonator may be used in an on-chip oscillator, or as a bandpass filter driven by an external clock.

DETAILED DESCRIPTION OF THE EMBODIMENTS

Figure 1:
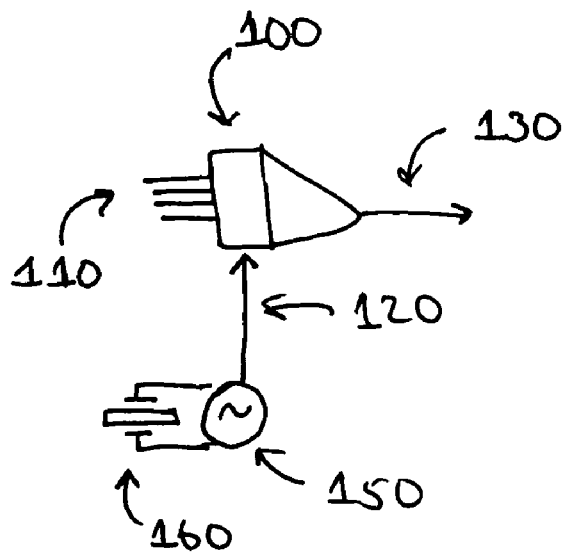
FIG. 1 shows a clocked digital to analog converter as known to the art.

FIG. 1 shows a block diagram of a clocked digital to analog converter (DAC) 100. While many topologies and implementations are known to the art, a common implementation uses an R-2R resistor ladder connected to digital switches. Digital data 110 is input to DAC 100, with the digital data latched by clock signal 120, which starts the conversion. Analog output in the form of a voltage or a current is output at 130.

As shown in FIG. 1, clock signal 120 signal is commonly generated from an oscillator 150 using a quartz crystal 160 to determine the operating frequency. While oscillator 150 is shown as a single block, it may in practice be a complex subsystem in its own right, containing frequency multipliers and phase locked loops.

Ideally, clock signal 120 is precise and uniform and does not change over time or environmental variations. In the real world, however, imperfections may be present, the effect of such clock signal imperfections on DAC 100 is to alter the time at which the conversion takes place, causing the conversion to take place earlier or later than desired. One source of clock signal imperfections is clock Jitter. Jitter may be caused by noise in the clock signal itself, as from phase noise in a phase locked loop producing the clock signal. Jitter may be introduced by transmission line effects such as noise contamination or impedance mismatches in distributing a clock signal across a complex integrated circuit or across a printed wiring board. Environmental changes such as temperature shifts may also alter the operating frequency of components such as quartz crystals.

The amount of clock jitter tolerable in a converter is a function of the conversion rate and the number of significant bits. In high-speed, multiple-bit conversion systems, clock jitter of one nanosecond can be equivalent to multiple bits of resolution, introducing distortion into the converted signal.

Figure 2:
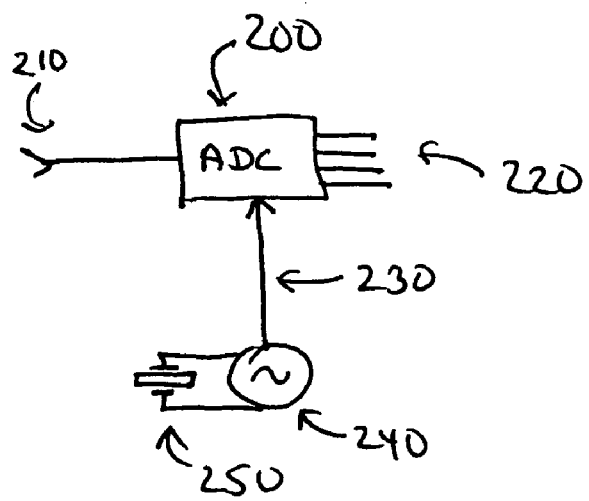
FIG. 2 shows a clocked analog to digital converter as known to the art.

FIG. 2 shows a clocked analog to digital converter as known to the art. Analog to digital converter (ADC) 200 accepts analog input signal 210 and produces a digital representation of this signal as output 220. Conversion is controlled by clock signal 230. Depending on the ADC topology, this clock signal initiates the conversion process and may also control other circuitry such as sample and hold (S/H) stages. Conversion clock 230 as shown in the simplified figure is provided by oscillator 240 which operates at a frequency determined by quartz crystal 250.

As with the digital to analog conversion process, timing precision is key. If conversion clock 230 is not accurate, ADC 200 will be sampling and converting the wrong portion of analog input 210. In high-speed, high-accuracy systems, clock jitter on the order of nanoseconds can be equivalent to multiple bits of resolution.

Crystal resonators, particularly quartz crystals, are often used as time bases in digital systems, but are limited to 50 MHz or lower in fundamental operation. To achieve higher frequencies, schemes such as phase locked loops or frequency multiplication must be used. Such schemes typically introduce noise and jitter into the resulting signal.

Crystal resonators, by their very nature, cannot be physically fabricated as part of an integrated circuit. Frequency multipliers typically contain tuned circuits, which cannot be fabricated as part of an integrated circuit. While much of the circuitry of a phase locked loop can be produced in integrated circuit form, the circuitry is complex, and some portions, such as the loop filter, involve discrete off-chip components.

In contrast, resonators formed from vibrating micromechanical systems (MEMS), are formed using standard integrated circuit manufacturing processes. They are smaller than other resonator systems, and provide higher quality (Q) factors than their electronic counterparts by two orders of magnitude or more.

MEMS resonators are described, for example, in United States Patent Application Publication No. 2004/0113722 to Bircumshaw, et al., entitled "MEMS Resonator and Method of Making Same," incorporated herein by reference.

Figure 3:
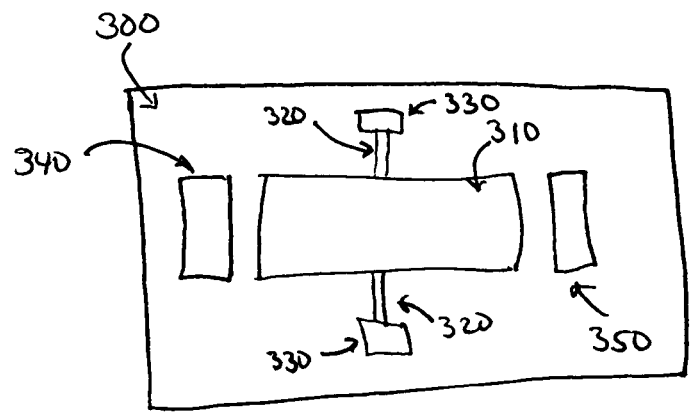
FIG. 3 shows a MEMS resonator.

As shown in FIG. 3, a MEMS resonator is fabricated on a substrate 300 using standard semiconductor fabrication processes. A resonating mass 310 having a longitudinal axis and which is suspended above a substrate via tethers 320 perpendicular to the longitudinal axis. The tethers are anchored 330 to the substrate. Tethers 320 and anchors 330 may be used to provide bias to resonating mass 310. While present semiconductor processing techniques favor rectangular cross-sections, virtually any shape may be used. Capacitive plates 340 and 350 couple to opposing surfaces of the resonating mass. One set of plates is typically used to drive the resonating mass, while the other set of plates senses motion.

Since the MEMS resonator is fabricated using the same semiconductor processes as the data converter, the MEMS resonator is easily integrated on to the same die. The resulting structure has a very high Q, in the range of 10,000 to 100,000, and a frequency range which may extend into the GHz region. Commonly used quartz, ceramic, or piezoelectric resonators cannot meet these specifications, and cannot be produced with standard integrated circuit processes, so they cannot be integrated onto the same die as the remaining circuitry.

Figure 4:
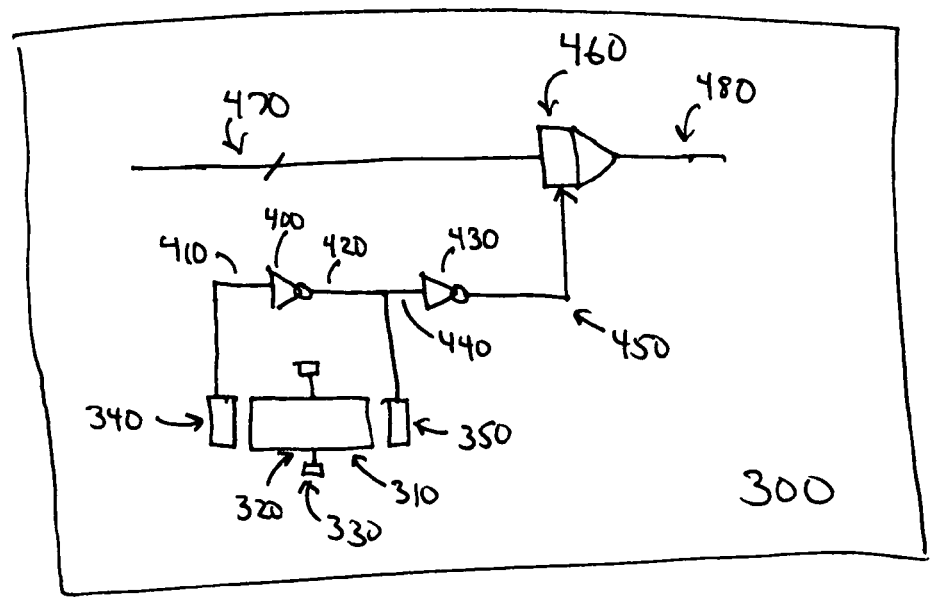
FIG. 4 shows a data converter clock using a MEMS oscillator.

The MEMS resonator may be used as the frequency determining component of an on-chip oscillator driving a data converter. FIG. 4 shows one topology, while other topologies are known to the art. In FIG. 4, D/A converter 460 takes digital data 470 and converts it to analog signal 480 based on conversion clock 450. Conversion clock 450 is generated by inverters 400 and 430 connected in series with MEMS resonator 310 providing feedback at the MEMS resonant frequency. DC bias may be applied to MEMS resonator 310 via tethers 320 and anchors 330. DC bias structures are not shown for clarity. MEMS resonator 310 provides the frequency-selective feedback path around inverter 400. The output 420 of inverter 400 drives MEMS resonator 310 through plate 350, with the input of inverter 400 connected to the output of MEMS resonator 310 via sense plate 340. Inverter 430 buffers the signal, its input 440 connected to the output 420 of inverter 400 and MEMS resonator plate 350. The output of the oscillator is obtained from the output 450 of inverter 430, isolating the MEMS oscillator from the load. As shown in FIG. 4, D/A converter 460, inverters 400 and 430, along with the MEMS resonator are fabricated on the same substrate 300. Other oscillator topologies common to the art may also be used, including but not limited to the panoply of Hartley, Pierce, or Colpitts topologies.

Figure 5:
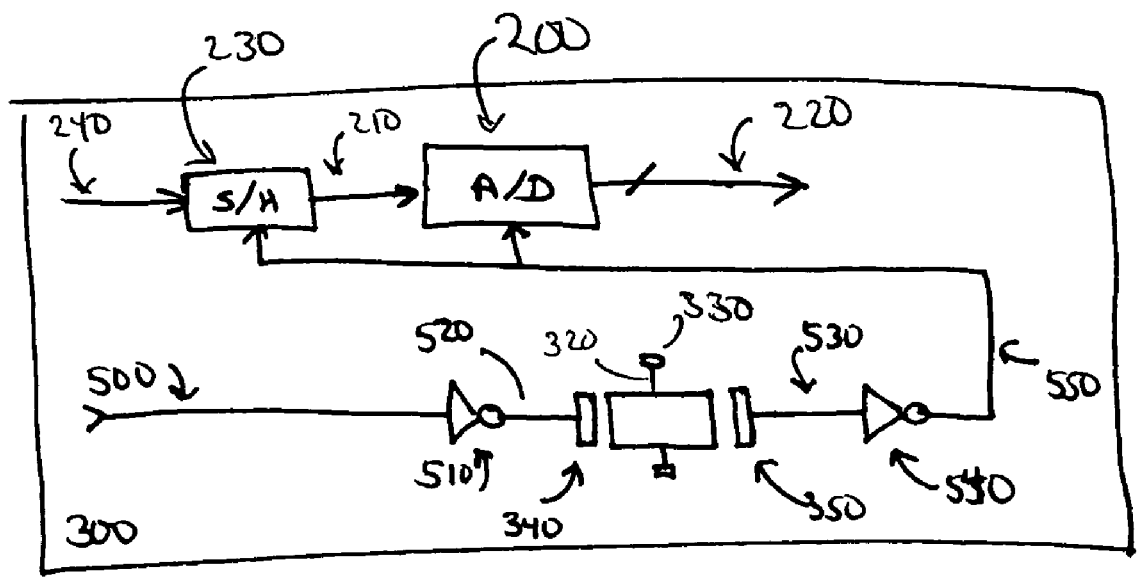
FIG. 5 shows a data converter clock using a MEMS filter.

FIG. 5 shows a MEMS resonator used as a bandpass filter for an analog to digital converter (A/D) clock. Analog input 240 feeds high-speed sample and hold (S/H) block 230, which provides analog input 210 to analog to digital converter (A/D) 200. Digital lines 220 provide a digital representation of the analog input signal. Clocking for sample and hold 230 and A/D 200 is provided by external clock signal 500 which drives buffer amplifier 510, providing isolation impedance matching between output 520 and the input plate 340 of MEMS resonator 310. Input 530 of amplifier 540 amplifies the output of MEMS resonator plate 350, and isolates it 550 from the load presented by the remainder of the circuitry. While inverters are shown for amplifiers 510 and 540, non-inverting amplifiers may also be used. As shown in FIG. 5, amplifiers 510 and 540, and MEMS resonator are manufactured on the same substrate 300, which also includes A/D 200 and sample and hold 230.

While the embodiments of the present invention have been illustrated in detail, it should be apparent that modifications and adaptations to these embodiments may occur to one skilled in the art without departing from the scope of the present invention as set forth in the following claims.

The invention claimed is:

1. A single chip clocked data converter, comprising:
   a data converter integrated into a single chip; and
   a MEMS resonator integrated into the single chip, and configured to provide a clock signal to the data converter, wherein the MEMS resonator is configured as a bandpass filter for an off-chip clock.

2. The single chip clocked data converter of claim 1, wherein the data converter is an analog to digital converter.

3. The single chip clocked data converter of claim 1, wherein the data converter is a digital to analog converter.

4. A single chip clocked data converter, comprising:
   a data converter integrated into a single chip;
   a MEMS resonator integrated into the single chip and configured as a bandpass filter; and
   circuitry configured to (1) provide an external clock signal to the MEMS resonator, and (2) provide a filtered clock signal, output from the MEMS resonator, to the data converter.

5. A single chip clocked data converter in accordance with claim 4, wherein the external clock is an off-chip clock.

6. A single chip clocked data converter in accordance with claim 5, wherein the circuitry configured to provide the external clock signal to the MEMS resonator includes an amplifier to amplify the off-chip clock.

7. A single chip clocked data converter in accordance with claim 5, wherein the circuitry configured to provide the external clock signal to the MEMS resonator includes a first amplifier to amplify the off-chip clock and wherein the circuitry configured to provide the filtered clock signal to the data converter includes a second amplifier between the MEMS resonator and the data converter.

8. A single chip clocked data converter in accordance with claim 7, wherein the first amplifier is a buffer amplifier that provides isolation impedance matching from the off-chip clock to the MEMS resonator.

9. A single chip clocked data converter in accordance with claim 7, wherein the second amplifier is configured to amplify the filtered clock signal output from the MEMS resonator, and to isolate the MEMS resonator from the data converter.

10. A single chip docked data converter in accordance with claim 4, wherein the circuitry configured to provide the filtered clock signal to the data converter comprises an amplifier between the MEMS resonator and the data converter.

* * * * *